(12) United States Patent
Shumarayev et al.

(10) Patent No.: US 7,903,679 B1
(45) Date of Patent: Mar. 8, 2011

(54) POWER SUPPLY FILTERING FOR PROGRAMMABLE LOGIC DEVICE HAVING HETEROGENEOUS SERIAL INTERFACE ARCHITECTURE

(75) Inventors: Sergey Shumarayev, Los Altos Hills, CA (US); Wilson Wong, San Francisco, CA (US); Thungoc M. Tran, San Jose, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1092 days.

(21) Appl. No.: 11/622,396

(22) Filed: Jan. 11, 2007

Related U.S. Application Data

(63) Continuation-in-part of application No. 11/402,417, filed on Apr. 11, 2006, now Pat. No. 7,616,657.

(51) Int. Cl.
*H04L 12/56* (2006.01)

(52) U.S. Cl. .................................. 370/419; 341/120

(58) Field of Classification Search .................. 370/419, 370/474, 328, 488, 286, 526, 362; 455/165, 455/188, 41
See application file for complete search history.

(56) References Cited

U.S. PATENT DOCUMENTS

| | | | | |
|---|---|---|---|---|
| 5,757,794 A * | 5/1998 | Young | ............................ | 370/362 |
| 6,160,859 A * | 12/2000 | Martin et al. | .................. | 375/345 |
| 6,246,693 B1 * | 6/2001 | Davidson et al. | ............. | 370/445 |
| 6,298,224 B1 * | 10/2001 | Peckham et al. | ........... | 455/188.1 |
| 6,356,158 B1 * | 3/2002 | Lesea | ............................. | 331/11 |
| 6,480,699 B1 * | 11/2002 | Lovoi | .............................. | 455/41.2 |
| 6,693,917 B1 * | 2/2004 | Feldman et al. | .............. | 370/488 |
| 6,856,180 B1 * | 2/2005 | Starr et al. | .................... | 327/147 |
| 7,082,143 B1 * | 7/2006 | LeBlanc et al. | ................ | 370/526 |
| 7,102,555 B2 * | 9/2006 | Collins et al. | .................. | 341/120 |
| 7,113,491 B2 * | 9/2006 | Graziano et al. | .............. | 370/286 |
| 7,138,816 B2 * | 11/2006 | Liu | ................. | 324/763 |
| 7,138,820 B2 * | 11/2006 | Goetting et al. | .................... | 326/9 |
| 7,209,523 B1 * | 4/2007 | Larrick et al. | ................ | 375/295 |
| 7,386,286 B2 * | 6/2008 | Petrovic et al. | ............ | 455/165.1 |
| 7,408,898 B1 * | 8/2008 | Brown | .......................... | 370/328 |
| 7,548,549 B2 * | 6/2009 | Bergeron et al. | .............. | 370/419 |
| 7,580,684 B2 * | 8/2009 | Cyr et al. | .......................... | 455/75 |
| 7,787,575 B2 * | 8/2010 | Dawson et al. | ................ | 375/354 |
| 2004/0190553 A1 * | 9/2004 | Ward et al. | ..................... | 370/474 |
| 2006/0202714 A1 * | 9/2006 | Hoang et al. | ..................... | 326/38 |
| 2007/0189411 A1 * | 8/2007 | Goss | .............................. | 375/272 |

(Continued)

OTHER PUBLICATIONS

Shumarayev et al. U.S. Appl. No. 11/292,565, filed Dec. 2, 2005.

(Continued)

*Primary Examiner* — Thong H Vu
(74) *Attorney, Agent, or Firm* — Ropes & Gray LLP; Jeffrey H. Ingerman

(57) ABSTRACT

In a programmable logic device with a number of different types of serial interfaces, different power supply filtering schemes are applied to different interfaces. For interfaces operating at the lowest data rates—e.g., 1 Gbps—circuit-board level filtering including one or more decoupling capacitors may be provided. For interfaces operating at somewhat higher data rates—e.g., 3 Gbps—modest on-package filtering also may be provided, which may include power-island decoupling. For interfaces operating at still higher data rates—e.g., 6 Gbps—more substantial on-package filtering, including one or more on-package decoupling capacitors, also may be provided. For interfaces operating at the highest data rates—e.g., 10 Gbps—on-die filtering, which may include one or more on-die filtering or regulating networks, may be provided. The on-die regulators may be programmably bypassable allowing a user to trade off performance for power savings.

31 Claims, 3 Drawing Sheets

U.S. PATENT DOCUMENTS

2007/0230554 A1* 10/2007 Said et al. .................. 375/232
2007/0231970 A1* 10/2007 Fukuo et al. ................ 438/127

OTHER PUBLICATIONS

Shumarayev et al. U.S. Appl. No. 11/295,391, filed Dec. 5, 2005.

Hoang et al. U.S. Appl. No. 11/329,197, filed Jan. 9, 2006.
Sergey Shumarayev et al. U.S. Appl. No. 11/402,417, filed Apr. 11, 2006.
Hoang et al. U.S. Appl. No. 11/430,469, filed May 8, 2006.

* cited by examiner

US 7,903,679 B1

POWER SUPPLY FILTERING FOR PROGRAMMABLE LOGIC DEVICE HAVING HETEROGENEOUS SERIAL INTERFACE ARCHITECTURE

CROSS REFERENCE TO RELATED APPLICATION

This is a continuation-in-part of copending, commonly-assigned U.S. patent application Ser. No. 11/402,417, filed Apr. 11, 2006, which is hereby incorporated by reference herein in its entirety.

BACKGROUND OF THE INVENTION

This invention relates to power supply filtering for serial interfaces in a programmable logic device (PLD), and more particularly to power supply filtering for PLDs having several different types of serial interface.

PLDs frequently incorporate serial interfaces to accommodate different serial input/output ("I/O") standards. In addition to lower-speed serial I/O standards, such as the LVDS (Low-Voltage Differential Signalling) standards, including, e.g., SPI-4.2 (System Packet Interface 4.2) and HyperTransport 1.0, there are several different high-speed serial I/O standards with speeds ranging from 1 Gbps up to as much as 10 Gbps. At one time, the trend was toward "universal" serial interfaces that could handle the entire range of I/O standards and speeds that might be encountered. However, the current trend, exemplified, e.g., by above-incorporated application Ser. No. 11/402,417, is to provide a plurality of different interfaces for different serial I/O standards, with the number of each type of interface differing according to the expected amount of use of the different standards. Thus, generally, the lower the speed called for by a particular I/O standard, the more interfaces for that standard would be provided.

Various noise sources exist that may affect the I/O interfaces. First, there may be noise sources on the PLD die itself. Second, there may be noise sources introduced in the device packaging. Third, in an end-user system in which the PLD is mounted on a circuit board, there may be noise sources introduced by other circuitry on that circuit board. Moreover, which interface is affected by a particular noise source is a function of the frequency of the noise source and its relationship to the frequency (i.e., the speed or data rate) of the interface.

One way of dealing with the effect of noise on an I/O interface is to filter the I/O interface power supply. However, previous attempts at power supply filtering have been global in nature—i.e., they have been "one-size-fits-all" approaches that apply a single power supply filtering scheme to the PLD or to the system containing the PLD.

SUMMARY OF THE INVENTION

The present invention provides targeted power supply filtering to different parts of a PLD or of a system containing a PLD. Preferably, high-frequency noise is addressed on the die, noise with frequencies in the middle range are addressed on the package, and low-frequency noise is addressed on the system board (if any). The package-level power supply filtering preferably includes at least one on-package decoupling capacitor, but may rely instead on power island decoupling. Similarly, board-level power supply filtering preferably includes decoupling capacitors for low-frequency noise, which are generally large, which is the reason that such power supply filtering is preferably provided at the board level.

In addition, the power supply filtering applied to particular transceivers preferably takes into account the characteristics of the transceiver, and particularly its speed or data rate, as well as its power and performance requirements. Therefore, the highest-rate transceivers preferably are provided with the most elaborate power supply filtering, while the lowest-rate transceivers preferably are provided with the least elaborate power supply filtering. Preferably, at least some of the power supply filtering circuitry is programmably bypassable to allow user optimization as described below.

Thus, in accordance with the present invention, there is provided filter circuitry for a serial interface in a programmable logic device. The programmable logic device is fabricated on a die which is packaged in a package. The filter circuitry includes die-level filtering circuitry for filtering a first range of frequencies, and package-level filtering circuitry for filtering a second range of frequencies lower than the first range of frequencies.

A system including a programmable logic device incorporating such filter circuitry is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
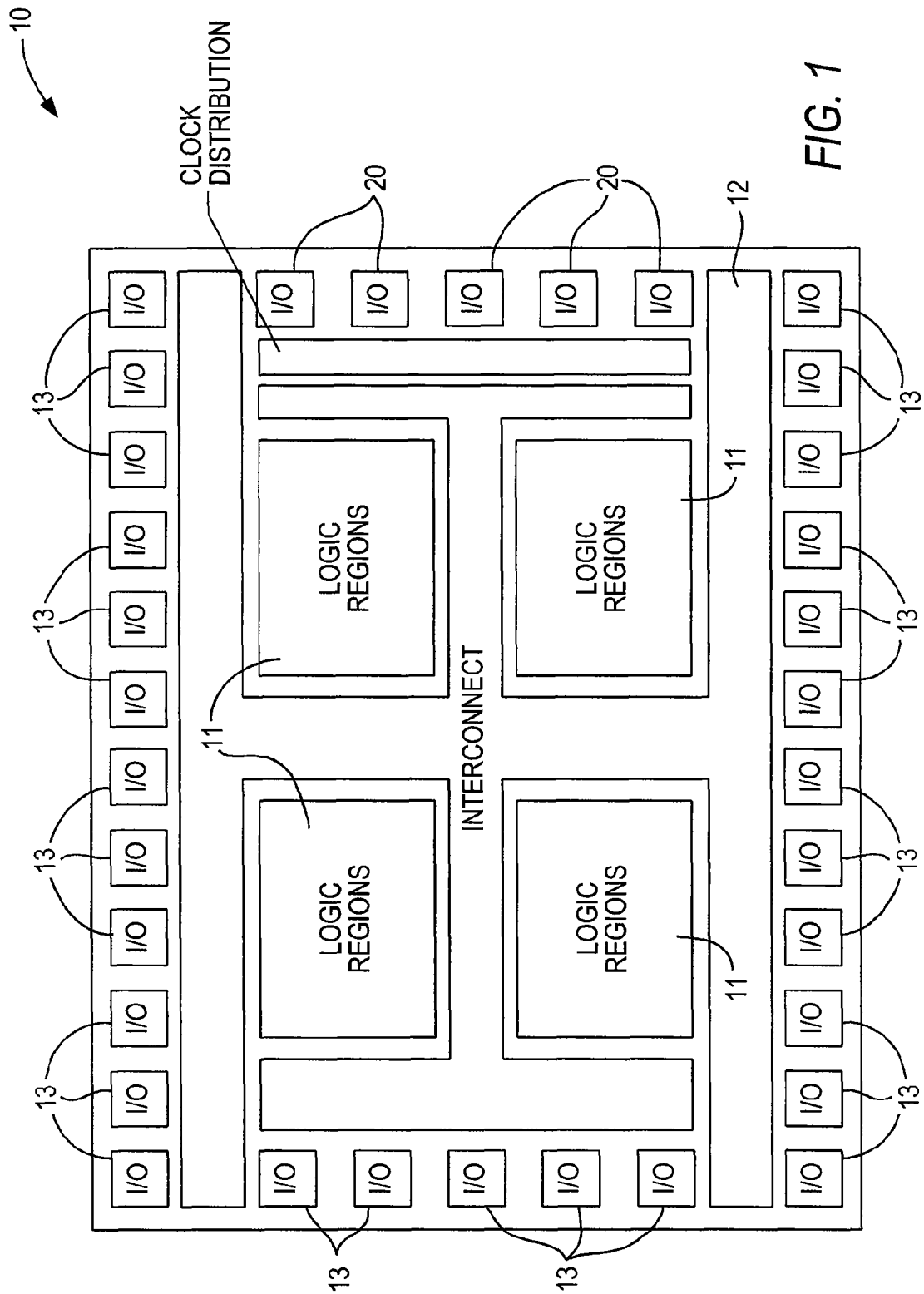
FIG. 1 is a block diagram of a preferred embodiment of a programmable logic device incorporating the present invention.
Figure 2:
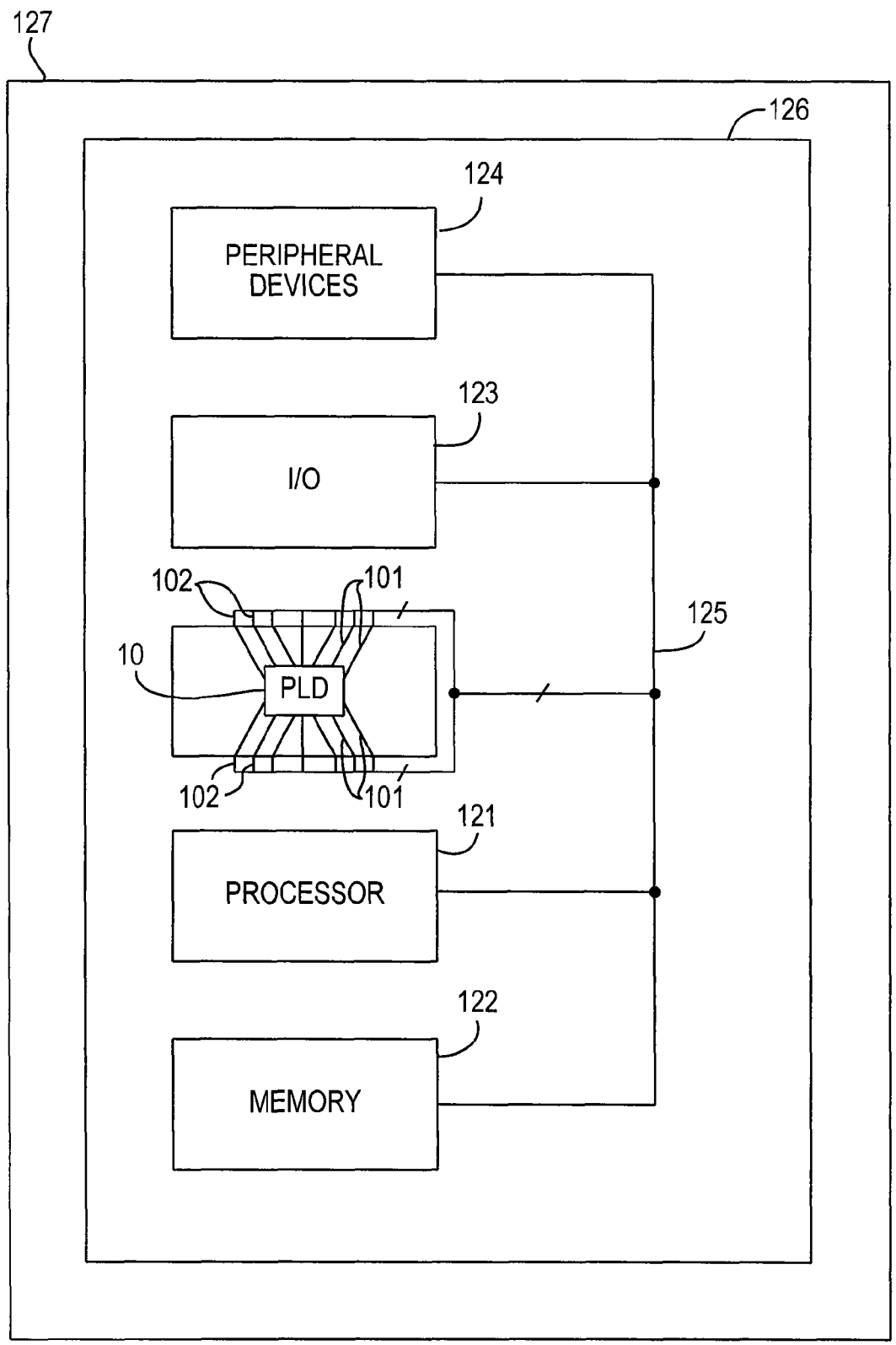
FIG. 2 is a schematic representation of the programmable logic device of FIG. 1 incorporated in a package, which in turn is mounted on a circuit board in a system in accordance with the present invention.

As discussed above, in PLDs with a heterogeneous transceiver architecture, power supply filtering is strategically applied in accordance with the present invention to optimize power supply filtering without excessive cost or power penalties. Strategic application of power supply filtering preferably includes targeting the amount of filtering to the type of transceiver and its sensitivity to noise. Strategic application of power supply filtering also preferably includes targeting the filtering to the correct device or system level. Certain frequencies may be best addressed at the die level, while others may be best addressed at the package level. If the PLD is included on a circuit board of an end-user system, then still other frequencies may be best addressed at the board level. Taken together, these approaches provide power supply filtering over a wide frequency range in a targeted manner.

Specifically, high-frequency power supply filtering preferably is performed on the die, power supply filtering of middle-range frequencies preferably is performed on the package, and low-frequency power supply filtering preferably is performed on the circuit board. Power supply filter circuitry may include reactive elements, as is known, preferably including inductors or, more preferably, capacitors. In some cases, depending on the amount of filtering required and the size of the capacitor needed, the capacitor may be a discrete capacitor, or may be provided by routing and placement of power supply islands relative to ground, as discussed in more detail below.

Thus, for low-frequency power supply filtering requiring large external capacitors, those capacitors may be easiest to provide on the system board (if any), and therefore that is where low-frequency power supply filtering circuitry preferably is provided. Mid-frequency power supply filtering typically requires somewhat smaller capacitors and preferably mid-frequency power supply filtering circuitry is provided at the package level, where on-package decoupling capacitors preferably are provided discretely or, more preferably and where the required capacitance permits, by routing and placement of the power supply and ground. High-frequency power supply filtering circuitry preferably is provided on the die and preferably includes on-die decoupling capacitors and may also include one or more on-die regulators or filtering networks. Because the on-die filtering circuitry consumes power, additional circuitry—e.g., programmable switches—preferably is provided on the die to programmably bypass the on-die regulators, giving the user the ability to balance performance and power consumption for a particular design by programmably selecting the amount of power supply filtering.

This approach provides proper power supply filtering that targets reduced power distribution network impedance across a wide frequency range. As described, high frequencies preferably are addressed on the die, middle-range frequencies preferably are addressed on the package with the on-package decoupling capacitor(s), and low-range frequencies preferably are addressed on the board where large de-coupling capacitors can more easily be provided. Additional power distribution network filtering considerations preferably also are considered, such as data rate, power and performance requirements. For example, there may be high-speed serial channels that run at 1 Gbps, while others run at 10 Gbps, and still others at speeds in between. In the future, data rates above 10 Gbps may be available.

Of all those channels, a 10 Gbps transceiver runs at the highest data rate and consumes the most power, yet has smallest data eye. As a result, a 10 Gbps transceiver has, among those channels, the most elaborate filtering requirements, including, e.g., large external capacitance, expensive on-package regulation, and internal on-die regulation, to make sure that all 10 Gbps channels are capable of running at that rate, notwithstanding any noise in the programmable logic core and any I/O noise. This is because 10 Gbps data (transmitted, e.g., as a 23-bit pseudorandom binary sequence—PRBS-23) typically has a high spectral content, requiring recovery of data from all frequencies between 0 Hz (DC) and about 10 GHz, by which most of the data signal energy is recovered. At the other extreme, most of the data signal energy of 1 Gbps PRBS-23 data typically will be captured by 1 GHz, so that a 1 Gbps transceiver does not require internal regulation and also can tolerate greater data eye noise. Preferably, sufficient filtering is provided so that each channel type can cover a frequency range up to twice its maximum data rate.

More generally, one can consider a system having, e.g., channels that operate at 1 Gbps, 3 Gbps, 6 Gbps and 10 Gbps. However, not every system will necessarily have all of these channels, and the number of a particular type of channel will vary from system to system even where that type of channel is present.

1 Gbps channels can be expected to operate well with only small circuit-board-level decoupling, small, if any, package-level decoupling, and small, if any, die-level decoupling. Because decoupling typically is provided by providing reactance, generally in the form of capacitance (although inductance also may be included), this means that at the package and die levels, dedicated on-package decoupling capacitors or on-die decoupling capacitors may not be required. Any necessary package-level decoupling preferably can be provided by judiciously placing power supply islands relative to related ground, or otherwise controlling the relationship between the power supply and ground. Similarly, complicated die-level regulators may not be required, and preferably at most only modest die-level decoupling is required. As for board-level decoupling, providing any necessary capacitance or inductance at the board level is easy and relatively inexpensive. Thus, at all three levels, only relatively inexpensive decoupling measures preferably are required. Because it can be expected that the type of transceiver that would be most common in a system would be the slowest ones—i.e., these 1 Gbps channels which require only relatively easy and inexpensive decoupling measures—that will minimize the cost and complexity added to the system by the decoupling requirements.

3 Gbps channels can be expected to require board-level decoupling to reduce the power distribution network impedance for operation in the frequency range up to about 200 MHz, modest package-level de-coupling for operation in the frequency range from about 200 MHz to about 500 MHz, and internal on-die regulation (particularly of the voltage-controlled oscillator) to reduce noise injection and pick-up in the frequency range between about 500 MHz and about 3 GHz. It can be expected that there will be a modest number of these channels, and the aforementioned "modest" package-level de-coupling is based on the amount of noise expected. For example, if the number of such channels is held sufficiently low, power island decoupling, as described above for the 1 Gbps channels, may be sufficient, but for a larger number of such channels, on-package decoupling elements (e.g., capacitors) may have to be added. Such channels typically appear in groups of four, or, more commonly, eight. A "sufficiently low" number of channels for this purpose might be 24, but ultimately is a function of device (die) and package size.

On-package decoupling also may be required if there are other noise sources, such as a larger-than-expected number of other I/O channels in the system, as a function of the quality of the power distribution network, and the current drawn by each I/O channel in a particular application.

6 Gbps channels can be expected to require board-level decoupling to reduce the power distribution network impedance for operation in the frequency range up to about 200 MHz, modest package level de-coupling for operation in the frequency range from about 200 MHz to about 500 MHz, and internal on-die regulation of one or more of the voltage-controlled oscillator (VCO), the charge pump (CP) and the phase-frequency detector (PFD) to reduce noise injection and pick-up in the frequency range between about 500 MHz and about 6 GHz. Although these 6 Gbps channels have stricter filtering requirements than the 1 Gbps channels or the 3 Gbps channels, it can be expected that fewer 6 Gbps channels than 1 Gbps or 3 Gbps channels will be required in a particular system. As in the case of the 3 Gbps channels, on-package decoupling may be required if there are other noise sources, such as a larger-than-expected number of other I/O channels in the system, or if there are more than about, e.g., 20 6 Gbps channels.

10 Gbps channels require more extensive board- and package-level decoupling than any of the aforementioned channels, at least because they have both the smallest data eye and the highest power consumption, as well as high VCO gain (Kvco) which results in high sensitivity to noise. In addition separate on-die regulators preferably are provided for each different type of circuitry to be protected (e.g. VCO, CP, PFD, etc.). Significant die area is devoted to die-level capacitors covering the frequency range up to about 10 GHz. However, it can be expected that there will be relatively few of these channels, minimizing the overall impact of the filtering requirements on device size and cost.

The value of the capacitance (or inductance) required for any particular filtering application may be determined based on the quality of the impedance of the power distribution network to be filtered. As is well known, the impedance is proportional to the square root of the ratio of inductance to capacitance, including any intrinsic inductance or capacitance of the power distribution network.

The invention will now be described with reference to FIGS. 1-4.

PLD 10, shown schematically in FIG. 1, is one example of a device incorporating high-speed serial interfaces 20 (FIG. 3) filtered according to the invention. PLD 10 has a programmable logic core including programmable logic regions 11 accessible to programmable interconnect structure 12. The layout of regions 11 and interconnect structure 12 as shown in FIG. 1 is intended to be schematic only, as many actual arrangements are known to, or may be created by, those of ordinary skill in the art.

PLD 10 also includes a plurality of other input/output ("I/O") regions 13. I/O regions 13 preferably are programmable, allowing the selection of one of a number of possible I/O signaling schemes, which may include differential and/or non-differential signaling schemes. I/O regions 13 generally do not require special power supply filtering.

A PLD 10 incorporating interfaces 20 filtered according to the present invention may be used in many kinds of electronic devices. One possible use is in a data processing system 120 shown in FIG. 2. Data processing system 120 may include PLD 10 inside package 100, where leads 101 connect to package pins 102, as well as one or more of the following components: a processor 121; memory 122; I/O circuitry 123; and peripheral devices 124. These components are coupled together by a system bus 125 and are populated on a circuit board 126 which is contained in an end-user system 127.

System 120 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 121. PLD 10 may also be used as an arbiter for arbitrating access to a shared resources in system 120. In yet another example, PLD 10 can be configured as an interface between processor 121 and one of the other components in system 120. It should be noted that system 120 is only exemplary, and that the true scope and spirit of the invention should be indicated by the claims which follow.

Figure 3:
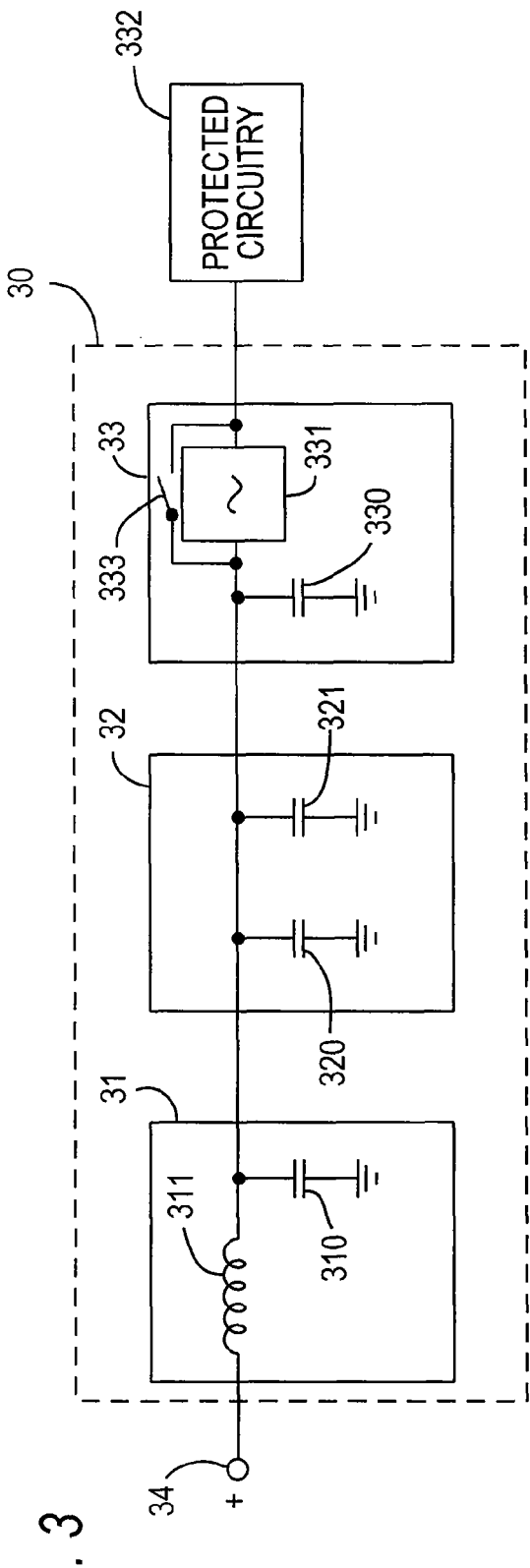
FIG. 3 is a schematic representation of power supply filter circuitry in accordance with the present invention.

FIG. 3 shows how filtering may be applied to a serial interface 20 in accordance with a preferred embodiment of the present invention. In FIG. 3, a exemplary filter circuit 30 is shown divided among board-level filter circuitry 31, package-level filter circuitry 32 and PLD die-level filter circuitry 33. As discussed above, depending on the type of interface that serial interface 20 is, one or more levels of filtering 31, 32, 33, may be omitted. The example in FIG. 3 shows all levels being present.

The power supply to be filtered is applied at terminal 34 and is filtered first at the level of board 126 by circuitry 31, which preferably includes one or more (one shown) external decoupling capacitors 310 and one or more (one shown) optional inductors 311. Capacitors 310 and inductors 311 at the board level may be conventional discrete capacitors and inductors of various known types.

After filtering at the board level by circuitry 31, the partially filtered power supply preferably is filtered at the package level by filter circuitry 32, which preferably includes two types of capacitances 320, 321. Preferably, each capacitance 320 (one shown) is a capacitor element provided within package 100, either as discrete elements or formed as part of the packaging, as would be well known to one of ordinary skill in the art, and each capacitance 321 (one shown) preferably is provided by strategically routing power conductors relative to the ground plane.

Finally, after filtering at the package level by circuitry 32, the partially filtered power supply preferably is filtered at the die level by filter circuitry 33. Filter circuitry 33 may include one or more (one shown) on-die coupling capacitors 330. Filter circuitry 33 preferably also includes one or more (one shown) on-die regulators or filtering networks 331. Preferably each such regulator or filtering network 331 is matched to the characteristics of particular circuitry 332, which is usually sensitive analog circuitry, that it is meant to protect.

Figure 4:
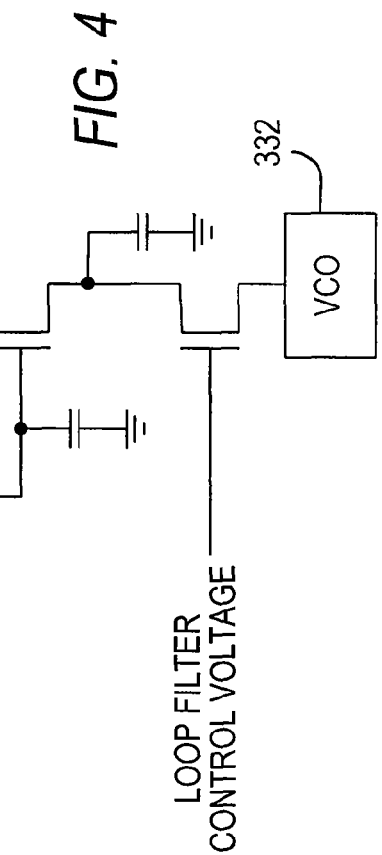
FIG. 4 is a schematic representation of one example of a filter/regulator in accordance with the present invention.

One example of regulator or filtering network 331 is shown in FIG. 4, where circuitry 332 to be protected is a VCO. Regulator or filtering network 331 as depicted in FIG. 4 is substantially conventional, designed to complement interface frequency requirements and sensitivity differences, by dropping noise levels by certain amount at specific frequency points. As is apparent from FIG. 4, regulator or filtering network 331 includes elements that consume power, and such networks typically require a 3.3-volt or 2.5-volt power supply, as compared to 1.2 volts or 1.4 volts for most other typical components of PLD 10. Therefore, one or more of the regulators or filtering networks 331 may be provided with a programmable bypass 333, preferably programmable by a user as part of the regular PLD programming process, allowing a user to decide whether it is more important to filter the noise and get better performance, or to forego filtering and conserve power while eliminating the need for a higher-voltage power supply.

Various technologies can be used to implement PLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. Filter circuitry for a serial interface in a programmable logic device, said programmable logic device being fabricated on a die which is packaged in a package, said filter circuitry comprising at least one of:
   die-level filtering circuitry for filtering a first range of frequencies; and
   package-level filtering circuitry for filtering a second range of frequencies lower than said first range of frequencies.

2. The filter circuitry of claim 1 wherein at least one of said die-level filtering circuitry and said package-level filtering circuitry comprises a reactance.

3. The filter circuitry of claim 2 wherein said reactance comprises a capacitor.

4. The filter circuitry of claim 1 wherein said package-level filtering circuitry comprises selective routing of power relative to ground.

5. The filter circuitry of claim 1 wherein said die-level filtering circuitry further comprises one of (a) a respective filter network, and (b) a respective regulator circuit, each said respective filter network and respective regulator being matched to a respective portion of said serial interface.

6. The filter circuitry of claim 5 wherein said die-level filtering circuitry further comprises a respective selectable bypass for each said respective filter network and respective regulator.

7. The filter circuitry of claim 1 wherein, when said package is mounted on a circuit board, said filter circuitry for said serial interface further comprises at least one of:
said die-level filtering circuitry;
said package-level filtering circuitry; and
board-level filtering circuitry for filtering a third range of frequencies lower than said second range of frequencies.

8. The filter circuitry of claim 7 wherein said board-level filtering circuitry comprises a reactance.

9. The filter circuitry of claim 8 wherein said reactance comprises a capacitor.

10. The filter circuitry of claim 8 wherein said reactance comprises an inductor.

11. The filter circuitry of claim 7 wherein:
said serial interface operates at a data rate up to about 1 Gbps; and
said filter circuitry comprises said board-level filter circuitry.

12. The filter circuitry of claim 11 wherein:
said filter circuitry further comprises said package-level filter circuitry; and
said package-level filter circuitry comprises selective routing of power relative to ground.

13. The filter circuitry of claim 7 wherein:
said serial interface operates at a data rate up to about 3 Gbps; and
said filter circuitry comprises said board-level filter circuitry and said package-level filter circuitry.

14. The filter circuitry of claim 13 wherein:
said serial interface comprises a voltage-controlled oscillator; and
said filter circuitry further comprises said die-level filter circuitry to filter said voltage-controlled oscillator.

15. The filter circuitry of claim 7 wherein:
said serial interface operates at a data rate up to about 6 Gbps; and
said filter circuitry comprises said board-level filter circuitry, said package-level filter circuitry, and said die-level filter circuitry.

16. The filter circuitry of claim 15 wherein:
said serial interface comprises a voltage-controlled oscillator, a loop filter, and a charge pump; and
said filter circuitry further comprises said die-level filter circuitry to filter at least one of said voltage-controlled oscillator, said loop filter, and said charge pump.

17. The filter circuitry of claim 16 wherein said die-level filter circuitry comprises one of (a) a respective filter network, and (b) a respective regulator circuit, each said respective filter network and respective regulator being matched to one of said voltage-controlled oscillator, said loop filter, and said charge pump.

18. The filter circuitry of claim 17 wherein said die-level filtering circuitry further comprises a respective selectable bypass for each said respective filter network and respective regulator.

19. The filter circuitry of claim 7 wherein:
said serial interface operates at a data rate up to about 10 Gbps; and
said filter circuitry comprises said board-level filter circuitry, said package-level filter circuitry, and said die-level filter circuitry.

20. The filter circuitry of claim 19 wherein:
said serial interface comprises a voltage-controlled oscillator, a loop filter, and a charge pump; and
said filter circuitry further comprises said die-level filter circuitry to filter said voltage-controlled oscillator, said loop filter, and said charge pump.

21. The filter circuitry of claim 20 wherein said die-level filter circuitry comprises one of (a) a respective filter network, and (b) a respective regulator circuit, each said respective filter network and respective regulator being matched to one of said voltage-controlled oscillator, said loop filter, and said charge pump.

22. The filter circuitry of claim 21 wherein said die-level filtering circuitry further comprises a respective selectable bypass for each said respective filter network and respective regulator.

23. The filter circuitry of claim 20 wherein said die-level filter circuitry further comprises a reactance.

24. The filter circuitry of claim 23 wherein said reactance comprises a capacitance.

25. A system including a programmable logic device fabricated on a die which is packaged in a package, said package being mounted on a circuit board with additional functional circuitry, said programmable logic device including at least one serial interface and filter circuitry for filtering said serial interface, said filter circuitry comprising, for each said serial interface, at least one of:
die-level filtering circuitry for filtering a first range of frequencies;
package-level filtering circuitry for filtering a second range of frequencies lower than said first range of frequencies; and
board-level filtering circuitry for filtering a third range of frequencies lower than said second range of frequencies.

26. The system of claim 25 wherein at least one of said die-level filtering circuitry, said package-level filtering circuitry, and said board-level filtering circuitry, comprises a reactance.

27. The system of claim 26 wherein said reactance comprises a capacitor.

28. The system of claim 26 wherein said board-level filtering circuitry comprises an inductor.

29. The system of claim 25 wherein said package-level filtering circuitry comprises selective routing of power relative to ground.

30. The system of claim 25 wherein said die-level filtering circuitry further comprises one of (a) a respective filter network, and (b) a respective regulator circuit, each said respective filter network and respective regulator being matched to a respective portion of said serial interface.

31. The system of claim 30 wherein said die-level filtering circuitry further comprises a respective selectable bypass for each said respective filter network and respective regulator.

* * * * *